US006124737A

United States Patent [19]

Lan et al.

[11] Patent Number: 6,124,737

[45] Date of Patent: Sep. 26, 2000

[54] LOW POWER CLOCK BUFFER HAVING A REDUCED, CLOCKED, PULL-DOWN TRANSISTOR

[75] Inventors: Jiann-Cherng James Lan, San Jose; Sudarshan Kumar, Fremont; Kamal J. Koshy, Santa Clara, all of Calif.

[73] Assignee: Intel Corporation, Santa Clara, Calif.

[21] Appl. No.: 09/345,972

[22] Filed: Jun. 30, 1999

[51] Int. Cl.[7] .................................... H03K 19/0948

[52] U.S. Cl. .................................... 326/121; 326/119

[58] Field of Search .................................... 326/121, 93, 95, 326/98, 119

[56] References Cited

U.S. PATENT DOCUMENTS 5,831,453 11/1998 Stamoulis et al. .................... 326/121

5,892,372 4/1999 Ciraula et al. .................... 326/121

*Primary Examiner*—Tan T. Nguyen

*Attorney, Agent, or Firm*—Blakely, Sokoloff, Taylor & Zafman LLP

[57] ABSTRACT

A clock buffer includes a clocked pull-up transistor and a clocked pull-down transistor. The clocked pull-up transistor has a drain coupled to an output line and a gate coupled to a clock signal line. The clocked pull-down transistor includes a drain coupled to the output line, a gate coupled to the clock signal line, and having a width Y. The buffer further includes a first pull-down transistor having a drain coupled to a source of the clocked pull-down transistor, a gate coupled to a first input signal line, and having a width that is at least 10% greater than Y. This clock buffer provides reduced power consumption in comparison to a more conventional clock buffer.

18 Claims, 3 Drawing Sheets

LOW POWER CLOCK BUFFER HAVING A REDUCED, CLOCKED, PULL-DOWN TRANSISTOR

The present invention relates to integrated circuits and more particularly to a clock buffer that includes a tapered pull-down transistor stack for reduced power consumption in a processor.

BACKGROUND

Computer systems, from small handheld electronic devices to medium-sized mobile and desktop systems to large servers and workstations, are becoming increasingly pervasive in our society. Computer systems typically include one or more processors. A processor manipulates and controls the flow of data in a computer by executing instructions. Decreasing the size of the processor and reducing its power consumption lowers the cost and improves the reliability of the processor. Processor designers employ many different techniques to decrease processor size and to reduce power consumption to create less expensive and more robust computers for consumers.

Typically, for a given frequency and voltage level, circuits having larger transistors that are actively switched tend to consume more power than circuits having smaller transistors that are actively switched. Therefore, designers strive to reduce the size of actively switched transistors, such as those that are gated (or clocked) by a high frequency clock signal. These transistors include, for example, clock buffer transistors having gates coupled to one or more clock signal lines.

Unfortunately, to increase processor speed at a given voltage level, the size of transistors that drive an output line may be increased to more strongly and quickly drive the output line. Thus, there is a struggle between the need for processor designers to increase the performance of a processor and the need to reduce the size of clocked transistors to reduce power consumption. The present invention addresses this struggle.

SUMMARY OF THE INVENTION

A clock buffer includes a clocked pull-up transistor and a clocked pull-down transistor. In accordance with one embodiment of the present invention, the clocked pull-up transistor has a drain coupled to an output line and a gate coupled to a clock signal line. The clocked pull-down transistor includes a drain coupled to the output line, a gate coupled to the clock signal line, and having a width Y. The buffer further includes a first pull-down transistor having a drain coupled to a source of the clocked pull-down transistor, a gate coupled to a first input signal line, and having a width that is at least 10% greater than Y.

Other features and advantages of the present invention will be apparent from the accompanying figures and the detailed description that follows.

BRIEF DESCRIPTION OF THE DRAWINGS

The present invention is illustrated by way of example and not limitation in the accompanying figures in which like references indicate similar elements and in which.

DETAILED DESCRIPTION

In accordance with an embodiment of the present invention, the power consumption of a clock buffer is reduced by tapering the pull-down transistor stack and placing the clocked pull-down transistor at the top of the stack. Unlike the pull-down transistors coupled to the input signals, the clocked transistor is switched with every clock pulse. By placing the clocked pull-down transistor at the top of the tapered pull-down transistor stack, the clocked pull-down transistor is constrained to be the smallest of the pull-down transistors in the stack. As a result, there is a significant power savings over a more conventional clock buffer NAND gate in which a much larger clocked pull-down transistor is placed at the bottom of an untapered stack.

A more detailed description of embodiments of the present invention, including various configurations and implementations, is provided below.

The terms "source" and "drain", as used herein, may be used interchangeably to identify either the source or drain of a p or n-channel transistor. The terms "size" and "width", as used herein, may be used interchangeably to refer to the width of a transistor, and the terms "large transistor" and "small transistor" refer to the width of the transistor. A "pull-up" transistor is a transistor that, when activated (i.e. turned on), has a tendency to raise the voltage level at its drain, "pulling" it (or driving it) up to the approximate voltage level at its source (which is typically close to the supply voltage level). This may be referred to as charging a node. A "pull-down" transistor is a transistor that, when activated, has a tendency to lower the voltage level at its drain, "pulling" it (or driving it) down to the approximate voltage level at its source (which is typically close to ground). This may be referred to as draining a node.

An "input node" is a physical, electrically conductive portion of a circuit that receives an electrical signal, as distinguished from an "input signal" which is the electrical signal itself. Typically, an input node is a transistor gate. An "output node" is a physical, electrically conductive portion of a circuit that sends (or drives) an electrical signal, as distinguished from an "output signal" which is the electrical signal itself. Typically, an output node is a transistor drain. An input signal is provided to an input node via an input signal line. An output signal is sent from an output node via an output signal line. Because a clock buffer designed in accordance with an embodiment of the present invention operates as a logical NAND gate, the terms "clock buffer" and "NAND gate" may be used interchangeably herein.

Figure 1A:
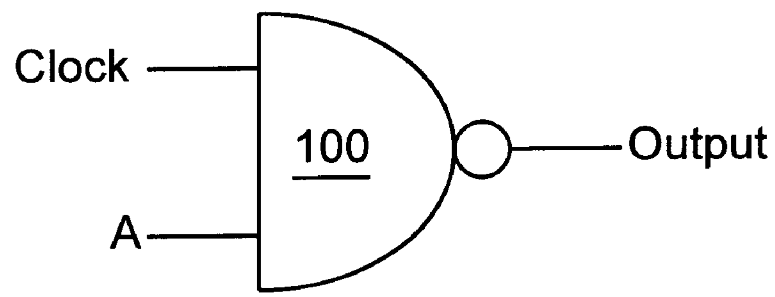
FIG. 1A is a single input clock buffer NAND gate gated by a clock signal in logic diagram form.

FIG. 1A is a single input clock buffer NAND gate gated by a clock signal in logic diagram form. A clock signal is transmitted to the upper input node of NAND gate 100 via a clock signal line. Input signal A is transmitted to the lower input node of NAND gate 100 via an input signal line. The output signal at the output node of NAND gate 100 is the result of a logical NAND function applied to the clock signal and input signal A.

Figure 1B:
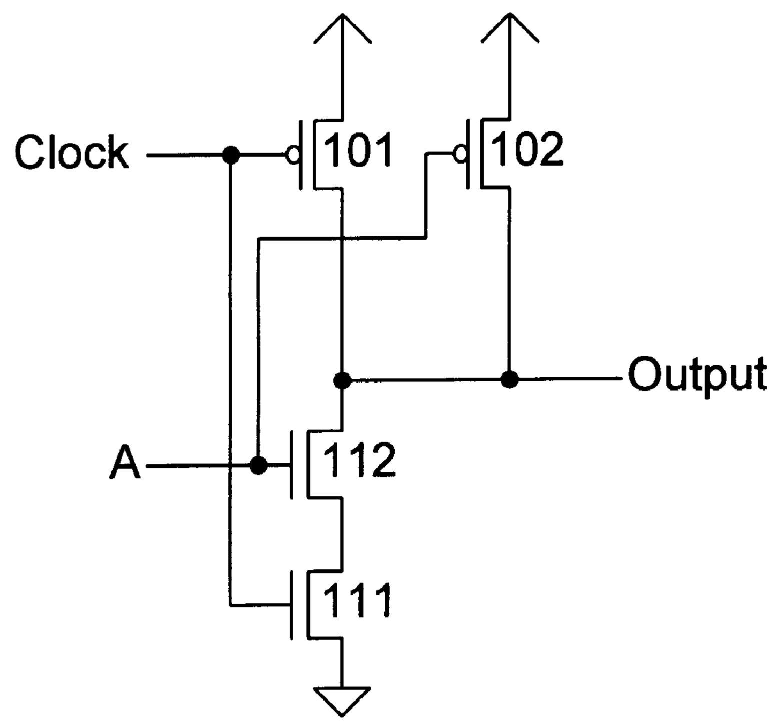
FIG. 1B is the clock buffer of FIG. 1A in circuit diagram form.

FIG. 1B is the clock buffer of FIG. 1A in circuit diagram form. NAND gate 100 includes pull-up transistor 101 and pull-down transistor 111, both coupled to the clock signal line for gating by the clock signal. NAND gate 100 further includes pull-up transistor 102 and pull-down transistor 112, both coupled to the input signal line for gating by input signal A.

Note that clocked pull-down transistor 111 of FIG. 1B is toggled with each clock pulse. In a typical processor in which the frequency of the clock signal is high and the clock signal is applied to numerous, large pull-down transistors, this constant toggling of the clocked pull-down transistors can amount to a substantial power drain. Reducing the size of clocked pull-down transistor 111 may reduce the power drain in the clock buffer of FIG. 1B. Unfortunately, the size of transistor 111 may not typically be reduced because transistor 111 must be large enough to not only drain the output node but also to overcome the RC load associated with transistor 112.

Figure 2:
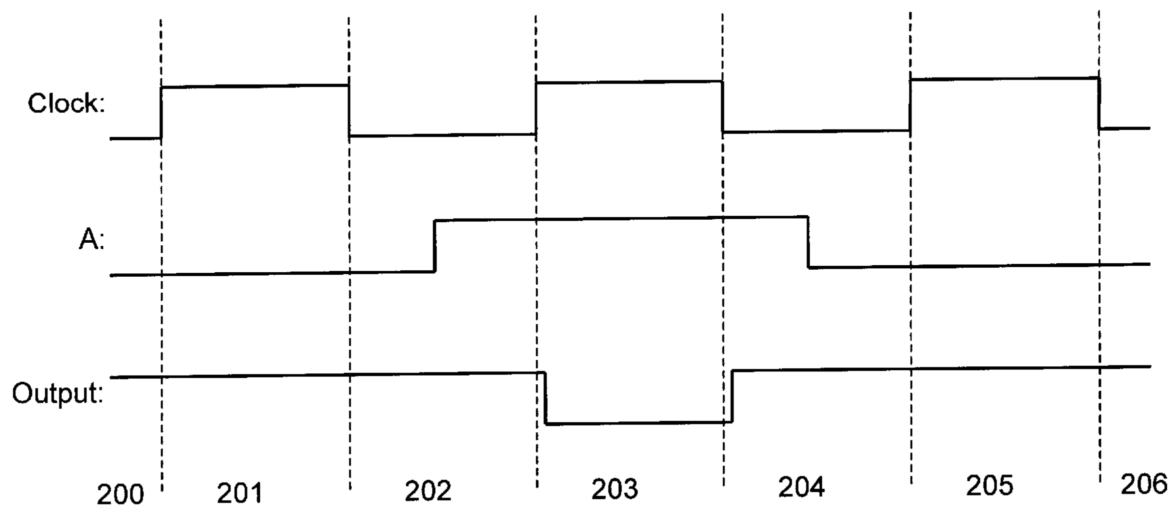
FIG. 2 is a timing diagram of the clock buffer of FIGS. 1A and 1B.

FIG. 2 is a timing diagram of the clock buffer of FIGS. 1A and 1B. The diagram has been divided into seven parts, 200–206, associated with pulse edges of the clock signal. Input signal A is low during time periods 200 and 201. During period 202, however, input signal A switches high. Signal A remains high through period 203 and switches low again during period 204. Signal A then remains low during periods 205 and 206. The output signal remains high during periods 200–202, and switches low during period 203. The output signal switches high again during period 204 and remains high during periods 205 and 206. Analyzing the timing diagram of FIG. 2, it can be seen that for this clock buffer, the output signal is triggered by the clock signal edge rather than the input signal edge, and the input signal only switches when the clock signal is low. This information can be used advantageously to redesign the clock buffer NAND gate of FIG. 1B to reduce power consumption while still meeting all timing requirements.

Figure 3:
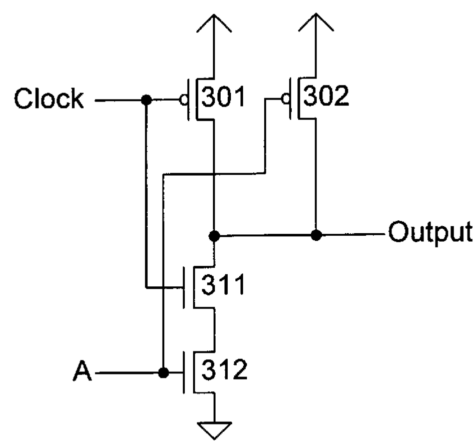
FIG. 3 is a clock buffer gated by a clock signal in accordance with one embodiment of the present invention.

FIG. 3 is a clock buffer gated by a clock signal in accordance with one embodiment of the present invention. This NAND gate includes pull-up transistor 301 and pull-down transistor 311, both coupled to the clock signal line for gating by the clock signal. The clock buffer further includes pull-up transistor 302 and pull-down transistor 312, both coupled to the input signal line for gating by input signal A. The sources of both p-channel pull-up transistors 301 and 302 are coupled to the power supply line ($V_{cc}$ or $V_{dd}$) of the integrated circuit upon which the buffer is formed. The drains of transistors 301 and 302 are coupled to the output line of the clock buffer. The drain of clocked n-channel pull-down transistor 311 is also coupled to the output line of the clock buffer, and its source is coupled to the drain of n-channel pull-down transistor 312. The source of transistor 312 is coupled to the ground line of the integrated circuit.

In accordance with one embodiment of the present invention, the pull-down transistor stack comprising pull-down transistors 311 and 312 is tapered such that transistor 312 is wider than transistor 311. For one embodiment of the present invention, transistor 312 may be at least 10% wider than transistor 311. For another embodiment, transistor 312 may be at least 25%, 50%, 75%, or 100% wider than transistor 311. For example, if transistor 311 is 12 microns wide, then in accordance with 10%, 25%, 50%, 75%, or 100% tapering, transistor 312 may be at least 13, 15, 18, 21, or 24 microns wide, respectively. For an alternate embodiment of the present invention, this tapering of the pull-down transistors can be applied to any number of transistors in a pull-down transistor stack of a clock buffer NAND gate that accommodates any number of inputs. For example, FIGS. 4 and 5 (described below) apply this tapering technique to a clocked NAND gate that accepts two select input signals in addition to the clock signal.

By tapering the pull-down transistor stack in this manner, the wider transistor lower in the stack (i.e. closer to the ground line) is sufficiently large to overcome the RC load of the smaller transistors higher in the stack (i.e. closer to the output line). By placing the clocked transistor at the top of the pull-down transistor stack, the clocked transistor width is smaller than the others in the stack. Thus, in accordance with an embodiment of the present invention, the most actively switched pull-down transistor, the clocked transistor, is also the smallest transistor in the pull-down transistor stack. As a result, the power consumed by a clock buffer designed in accordance with an embodiment of the present invention is reduced.

According to the timing diagram of FIG. 2, switching of the output signal is triggered by the clock signal rather than input signal A, and input signal A only switches when the clock signal is low. Applying this knowledge to the clock buffer of FIG. 3, it can be seen that clocked pull-up transistor 301 initially pulls the output line up from a low to high state. Pull-up transistor 302, when turned on (i.e. when input signal A goes low), merely reinforces the already high state of the output line. Because transistor 301 is the driving transistor on the output line, transistor 301 may be sized to meet the minimum critical timing of the gate. In contrast, the size of pull-up transistor 302 may be reduced to, for example, minimum dimensions because it is not in the critical path.

In accordance with one embodiment of the present invention, the width of transistor 302 of FIG. 3 may be at least 10% less than the width of transistor 301. For another embodiment, the width of transistor 302 may be at least 25% or 50% less than the width of transistor 301. For example, for an embodiment in which transistor 302 is at least 10% less than the width of transistor 301, if transistor 301 is 12 microns, then transistor 302 may be equal to or less than 11 microns. For an embodiment in which transistor 302 is at least 25% less than the width of transistor 301, if transistor 301 is 12 microns, then transistor 302 may be equal to or less than 9 microns. For an embodiment in which transistor 302 is at least 50% less than the width of transistor 301, if transistor 301 is 12 microns, then transistor 302 may be equal to or less than 6 microns. For an alternate embodiment of the present invention, this ratio of the pull-up transistors can be applied to any number of pull-up transistors in a clock buffer NAND gate that accommodates any number of inputs. For example, FIGS. 4 and 5 (described below) apply this sizing technique to a clocked NAND gate that accepts two select input signals in addition to the clock signal.

In addition to reducing the size of pull-up transistor 302 in comparison to transistor 102 of FIG. 1B, the size of clocked pull-up transistor 301 may also be reduced in comparison to transistor 101. In accordance with the tapering methodology described above, the width of clocked pull-down transistor 311 of FIG. 3 has been reduced. As a result, the RC load on the output line of the clock buffer, to which transistor 311 is coupled, is similarly reduced. Reduction of this load on the output line allows the width of pull-up transistor 301 to be reduced while still being able to meet the critical timing requirements of the gate. Reducing the width of the pull-up transistors of FIG. 3 reduces the size and power consumption of the buffer.

Figure 4:
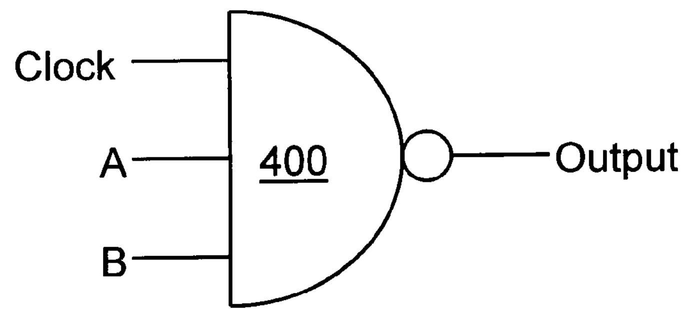
FIG. 4 is a dual input clock buffer NAND gate gated by a clock signal in logic diagram form.

FIG. 4 is a dual input clock buffer NAND gate gated by a clock signal in logic diagram form. A clock signal is transmitted to the upper input node of NAND gate 400 via a clock signal line. Input signal A is transmitted to the center input node of NAND gate 400 via an input signal line. Input signal B is transmitted to the lower input node of NAND gate 400 via another input signal line. The output signal at the output node of NAND gate 400 is the result of a logical NAND function applied to the clock signal, input signal A, and input signal B. In accordance with an embodiment of the present invention, a clock buffer may be designed utilizing the techniques described above to create a relatively compact, low power clock buffer.

Figure 5:
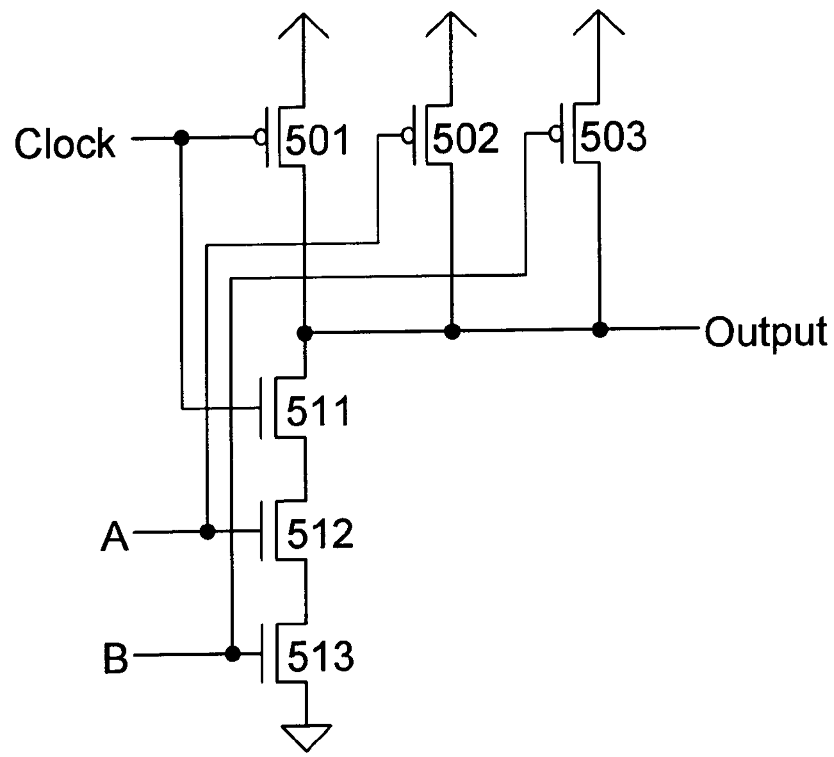
FIG. 5 is the dual input clock buffer of FIG. 4 gated by a clock signal in circuit diagram form in accordance with one embodiment of the present invention.

FIG. 5 is the dual input NAND gate clock buffer of FIG. 4 in accordance with one embodiment of the present invention. This NAND gate includes pull-up transistor 501 and pull-down transistor 511, both coupled to the clock signal line for gating by the clock signal. The clock buffer also includes pull-up transistor 502 and pull-down transistor 512, both coupled to an input signal line for gating by input signal A. The clock buffer further includes pull-up transistor 503 and pull-down transistor 513, both coupled to another input signal line for gating by input signal B. The sources of p-channel pull-up transistors 501, 502, and 503 are coupled to the power supply line. The drains of transistors 501, 502, and 503 are coupled to the output line of the clock buffer. The drain of clocked n-channel pull-down transistor 511 is also coupled to the output line of the clock buffer, and its source is coupled to the drain of n-channel pull-down transistor 512. The source of transistor 512 is coupled to the drain of n-channel pull-down transistor 513. The source of transistor 513 is coupled to the ground line.

In accordance with one embodiment of the present invention, the pull-down transistor stack comprising pull-down transistors 511, 512, and 513 may be tapered such that transistor 513 is wider than transistor 512, and transistor 512 is wider than transistor 511. Alternatively, the pull-down transistor stack may be tapered such that transistors 512 and 513 are both wider than transistor 511, but transistors 512 and 513 may be approximately equal in width, or transistor 512 may be wider than transistor 513.

For one embodiment of the present invention, the relationship in widths between transistors 511 and 512 may be similar to that described above between transistors 311 and 312, respectively. For another embodiment, the relationship in widths between transistors 511 and 513 may be similar to that described above between transistors 311 and 312, respectively. For another embodiment, the relationship in widths between transistors 512 and 513 may be similar to that described above between transistors 311 and 312, respectively. In general, for an embodiment of the present invention applied to a clock buffer NAND gate having any number of inputs, the relationship in widths between a higher transistor versus a lower transistor in the pull-down transistor stack may be similar to that described above between transistors 311 and 312, respectively.

Pull-up transistors 501, 502, and 503 of FIG. 5 may also be appropriately sized in accordance with an embodiment of the present invention to reduce power consumption and the overall size of the gate. Suppose the switching of the output signal of the clock buffer is triggered by the clock signal rather than by either input signals A or B, and further suppose that input signals A and B only switch when the clock signal is low. Pull-up transistors 501, 502, and 503 may then be sized as described above with respect to the pull-up transistors of FIG. 3. For example, for one embodiment, the relationship of the widths of transistors 502 or 503 to the width of transistor 501 may be similar to the relationship of the width of transistor 302 to the width of transistor 301, respectively, as described above. In general, for an embodiment of the present invention applied to a clock buffer NAND gate having any number of inputs, the relationship in widths of a pull-up transistor coupled to an input signal line versus a clocked pull-up transistor may be similar to that described above between transistors 302 and 301, respectively.

This invention has been described with reference to specific exemplary embodiments thereof. It will, however, be evident to persons having the benefit of this disclosure that various modifications and changes may be made to these embodiments without departing from the broader spirit and scope of the invention. The specification and drawings are, accordingly, to be regarded in an illustrative rather than a restrictive sense.

What is claimed is:

1. A clock buffer comprising:

a clocked pull-up transistor having a drain coupled to an output line, a gate coupled to a clock signal line, and having a width X;

a clocked pull-down transistor having a drain coupled to the output line, a gate coupled to the clock signal line, and having a width Y; and a first pull-down transistor having a drain coupled to a source of the clocked pull-down transistor, a gate coupled to a first input signal line, and having a width that is at least 10% greater than Y.

2. The clock buffer of claim 1, further comprising a first pull-up transistor having a drain coupled to the output line, a gate coupled to the first input signal line, and having a width that is at least 25% less than X.

3. The clock buffer of claim 2, further comprising a second pull-down transistor having a drain coupled to a source of the first pull-down transistor, a gate coupled to a second input signal line, and having a width that is at least 25% greater than Y.

4. The clock buffer of claim 3, further comprising a second pull-up transistor having a drain coupled to the output line, a gate coupled to the second input signal line, and having a width that is at least 25% less than X.

5. The clock buffer of claim 1, wherein the width of the first pull-down transistor is at least 25% greater than Y.

6. The clock buffer of claim 5, further comprising a first pull-up transistor having a drain coupled to the output line, a gate coupled to the first input signal line, and having a width that is at least 25% less than X.

7. The clock buffer of claim 5, further comprising a first pull-up transistor having a drain coupled to the output line, a gate coupled to the first input signal line, and having a width that is at least 50% less than X.

8. The clock buffer of claim 1, wherein the width of the first pull-down transistor is at least 50% greater than Y.

9. The clock buffer of claim 1, wherein the width of the first pull-down transistor is approximately 75% or more greater than Y.

10. The clock buffer of claim 9, further comprising a first pull-up transistor having a drain coupled to the output line, a gate coupled to the first input signal line, and having a width that is approximately 50% or more less than X.

11. A NAND gate comprising:

a clocked pull-up transistor having a drain coupled to an output line, a gate coupled to a clock signal line, and having a width X;

a clocked pull-down transistor having a drain coupled to the output line, a gate coupled to the clock signal line, and having a width Y;

a first pull-up transistor having a drain coupled to the output line and a gate coupled to a first input signal line; and a first pull-down transistor having a drain coupled to a source of the clocked pull-down transistor, a gate coupled to the first input signal line, and having a width that is at least 25% greater than Y.

12. The NAND gate of claim 11, wherein the width of the first pull-down transistor is approximately 75% or more greater than Y.

13. The NAND gate of claim 12, wherein a source of the first pull-down transistor is coupled to a ground line.

14. The NAND gate of claim 13, wherein the first pull-up transistor has a width that is approximately 50% or less of X.

15. A NAND gate comprising:

a clocked pull-up transistor having a drain coupled to an output line, a gate coupled to a clock signal line, a source coupled to a power supply line, and having a width X;

a clocked pull-down transistor having a drain coupled to the output line, a gate coupled to the clock signal line, and having a width Y;

a first pull-up transistor having a drain coupled to the output line, a gate coupled to a first input signal line, and a source coupled to the power supply line;

a first pull-down transistor having a drain coupled to a source of the clocked pull-down transistor, a gate coupled to the first input signal line, and having a width that is at least 50% greater than Y;

a second pull-up transistor having a drain coupled to the output line and a gate coupled to a second input signal line; and a second pull-down transistor having a drain coupled to a source of the first pull-down transistor, a gate coupled to the second input signal line, and having a width that is at least 75% greater than Y.

16. The NAND gate of claim 15, wherein widths of the first and second pull-up transistors are both at least 25% less than X.

17. The NAND gate of claim 15, wherein a source of the second pull-down transistor is coupled to a ground line.

18. The NAND gate of claim 15, wherein the width of the first pull-down transistor is at least 100% greater than Y.

* * * * *